United States Patent
Acciai et al.

(12)

(10) Patent No.: US 6,203,685 B1
(45) Date of Patent: Mar. 20, 2001

(54) APPARATUS AND METHOD FOR SELECTIVE ELECTROLYTIC METALLIZATION/DEPOSITION UTILIZING A FLUID HEAD

(75) Inventors: Michael Acciai, Newark Valley; Steven L. Tisdale, Endwell, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/234,382

(22) Filed: Jan. 20, 1999

(51) Int. Cl.⁷ ............................... C25D 5/00; C25D 7/06
(52) U.S. Cl. ......................... 205/137; 205/138; 205/96; 205/97
(58) Field of Search ............................ 204/198, 211, 204/269, DIG. 7; 205/137, 138, 96, 97

(56) References Cited

U.S. PATENT DOCUMENTS

| 4,164,454 | 8/1979 | Schober | 204/28 |
|---|---|---|---|
| 4,511,440 | 4/1985 | Saprokhin et al. | 204/60 |
| 4,749,460 | 6/1988 | Komoto et al. | 204/211 |
| 4,765,878 | 8/1988 | Komoto et al. | 204/211 |
| 4,986,888 | * 1/1991 | Hosten et al. | 204/198 |
| 5,292,424 | 3/1994 | Blasing et al. | 205/82 |
| 5,326,455 | * 7/1994 | Kubo et al. | 205/77 |
| 5,389,214 | 2/1995 | Erickson et al. | 204/149 |

FOREIGN PATENT DOCUMENTS

9306496 * 7/1993 (KR).

* cited by examiner

Primary Examiner—Edna Wong
(74) Attorney, Agent, or Firm—Scully, Scott, Murphy & Presser

(57) ABSTRACT

A transport system for the implementation of electrolytic deposition, coating or etching; and more particularly, an apparatus for selective electrolytic metallization and deposition utilizing a fluid head arrangement. A method is provided for making and maintaining an electrical contact with a product being processed in a transport system employed for selective electrolytic metallization and deposition, coating or etching. The method of making and maintaining an electrical contact with a product being processed may be utilizing a fluid head arrangement.

14 Claims, 3 Drawing Sheets

APPARATUS AND METHOD FOR SELECTIVE ELECTROLYTIC METALLIZATION/DEPOSITION UTILIZING A FLUID HEAD

BACKGROUND OF THE INVENTION

FIELD OF THE INVENTION

The present invention relates to a transport system for the implementation of electrolytic deposition, coating or etching; and more particularly, relates to an apparatus for selective electrolytic metallization and deposition utilizing a fluid head arrangement. The invention is also directed to a method of making and maintaining an electrical contact with a product being processed in a transport system employed for selective electrolytic metallization and deposition, coating or etching. Furthermore, the invention is also directed to a method of making and maintaining an electrical contact with a product being processed as described herein, utilizing a fluid head arrangement.

A critical feature of any electrolytic process, particularly such as may be employed for the electrolytic metallization or deposition of metallic materials on a substrate is to be able to make good electrical contact with hardware on the substrate; for example, such as circuit boards, which are to be processed through the electrolytic metallization and deposition operation. In some instances, in order to implement the foregoing there is employed a type of well known apparatus employing a so-called fluid head design, incorporating electrodes which can be activated for implementing the metallization and deposition processes. Ordinarily, a fluid head does not readily enable the processing of discrete structures or product which are transported in separate parts or piecewise, but rather is adapted for processing continuous foils or webs forming the substrate, but which will still maintain electrical contact with each part. Processing with a fluid head is normally considered to be better suited to the implementing of reel to reel applications of the electrolytic metallization and deposition process, where a communing bar can be fabricated within the roll or web of material which is to be processed. However, without the capability of providing a continuous electrical contact, these processes are impossible to implement within the construction or format of a fluid head for individual printed circuit board processing.

Basically, conventional vertical or horizontal electrolytic metallization devices typically handle a standard, and very specific, size panel, in essence, a substrate, for their everyday production. When the size of the panel varies, especially in connection with processing with horizontal devices, ordinarily the device has to be shut down and the electrodes baffled so that the "active" area is retained within the size of the panel which is to be transported. This activity requires that the device be shut down completely, opened up and modified; which, in turn, has to be then implemented a second time in order to return to the original panel size. This results in a significant amount of non-productive downtime, as well as requiring engineering supervision. On panels with varying circuit densities, if processed by means of electro-pattern plating, there are also encountered problems with varying thickness in the deposition due to uniformity of the current density across the single large electrode which is typically employed in conventional platers.

Various structures are currently disclosed in the prior art or employed in carrying out an metallizing process, such as the electrolytic deposition onto a substrate of metallic materials, for example, such as copper in order to produce electrolytic copper foils through the employment of a rotating cathode drum and an anode or plurality of sub-anodes which are located opposite the cathode drum.

Kubo, et al., U.S. Pat. No. 5,326,455 discloses a method and an apparatus for the production of electrolytic copper foil, wherein the apparatus utilizes a bath rather than one or more fluid heads for plating the foil, or alternatively employs a plurality of anodes with a single fluid head. The individual anodes can be controlled with respect to the quantity of electricity being supplied so as to provide for a uniform electrolytic deposition of a metallic material across the foil surface.

Erickson et al., U.S. Pat. No. 5,389,214 discloses a fluid treatment system, wherein electrically reconfigurable electrode arrangements are employed, and in which a controller alters the effective separation area between the active electrode in response to resistivity variations so as to provide an optimal operation of the system. There is no workpiece provided for effectuating electrolytic deposition of metallic material, but rather the disclosure is directed to the treatment of fluids.

Blasing, et al., U.S. Pat. No. 5,292,424 pertains to a method for controlling a work cycle in electroplating plants, wherein different levels of electrical currents are applied to a series of adjacently located electrodes. This structure is similar in operation to Kubo, et al., U.S. Pat. No. 5,326,455 due to the utilization of baths in order to derive the electrolytic deposition of the metallic materials.

Komoto, et al., U.S. Pat. Nos. 4,749,460 and 4,765,878, each provide for an apparatus for electrolytic plating wherein the plating currents of a plurality of successive plating cells are automatically controlled in accordance with specific conditions in order to maintain uniform thickness of the metallic material which is being deposited onto a substrate.

Saprokhin, et al., U.S. Pat. No. 4,511,440 discloses a process for the electrolytic production of fluorine; however, in which there is no individual control of an electrical power supply to anodes. Furthermore, there is no disclosure of any workpiece which is coated through the deposition of a metallic material by means of electrolytic plating operation, and this publication is merely directed to the production of fluorine gas.

Schober, U.S. Pat. No. 4,164,454 discloses a continuous line for plating on intermittent lengths of metallic strip material, wherein workpieces are moved past a plating apparatus with no provision being made for any individual control of a supply of electrical current to the anodes.

SUMMARY OF THE INVENTION

In essence, none of the prior art publications as set forth hereinabove disclose a novel and inventive concept which is directed to incorporating the advantages of currently employed fluid head technology into the implementation an electrolytic metallization, coating or etching process, or electrolytic plating, which would ordinarily not be considered to be possible to effectuate. Basically, the invention is directed to the provision of an external transport system wherein a cathode drum brush for supplying electrical current and a drive wheel of a substrate transport system are in intimate contact with components or hardware which is to be processed, such as printed circuit boards or the like, thereby facilitating continuous electrical contact with the components being processed which are being conveyed through the transport system, or fluid head during any specific period of time.

Pursuant to the invention there is disclosed an electrically conductive brush and drive wheel on opposite side edges of the workpiece being processed, which in essence contacts the workpiece enabling individual sheets or continuous rolls or webs to be processed during conveyance through transport system, the latter of which may comprise a fluid head, and by using the cathode brush and drive wheel for workpiece conveyance and for supplying electrical current.

In connection with the foregoing, the invention is directed to the provision of an electrolytic plating apparatus which includes a fluid-containing head having a fluid input; an arrangement to move workpieces past the fluid head, with a plurality of anodes being located within the head, each anode being individually controllable in its electrical potential in order to provide a specific electrical field strength at different positions of the workpiece, while the workpiece is moving past the fluid head. In particular, the brush cathode and the drive wheel which are located externally of the transport system, such as the fluid head, are at all times in physical and electrical contact with the workpiece during the electrolytic plating procedure, so as to maintain a constant electrical potential therewith.

By utilizing the concepts of the present invention, it is consequently possible to produce an electrolytic metallization and deposition system that can alleviate essentially all of the problems normally associated with conventional systems, which are incurred when attempting to manufacture printed circuit boards of various dimensions, as well as differences in circuit densities on the same process line.

Pursuant to the inventive structure, banks of anodes (or cathodes) are situated within the fluid head body such that at any given time either all or only specific areas within the working dimensions of the device can be activated from a keyboard control station. This allows for continuous operation of the system with only momentary interruptions for resetting the "active" area within the system. Compensation for extremely dense as well as very sparse areas of circuitry on the same panel or circuit board can be adjusted for, a feature not attainable on conventional systems. Thus, by employing the inventive concept, panel size and variations of circuit density no longer present any problem.

This concept system can be utilized for any type of electrochemical deposition process. Examples would be for CU, NI and AU, as well as any other metals. It can also be used to enhance coating operations, such as electrophoretic deposition processes. Another use would be to enhance electro-chemical etching techniques, essentially anything that would require a potential in order to be deposited or etched away from a substrate.

Accordingly, it is an object of the present invention to provide an apparatus comprising a transport system for conveying a workpiece for the purpose of implementing electrolytic metallization or deposition, including a plurality of anodes each individually controllable to an electrical potential, and with a brush cathode and drive wheel arrangement being in contact with the workpiece at all times during electrolytic plating.

A further object of the invention resides in the provision of a transport system as described herein which comprises a fluid head having a fluid input, with the transport system being able to move the workpiece past the fluid head, and wherein the brush cathode and the drive wheel structure for conveying the work piece are located externally of the fluid head and are in constant contact with the workpiece so as to be able to apply a constant electrical potential thereto.

Another object of the present invention resides in the provision of a method for making and maintaining electrical contact with a product being processed in a transport system utilizing a cathode brush and drive wheel for conveyance and concurrent electrical conduction, and with a plurality of anodes being selectively activatable in order to maintain predetermined electroplating conditions on a substrate.

BRIEF DESCRIPTION OF THE DRAWINGS

Reference may now be had to the following detailed description of a preferred embodiment of the invention, taken in conjunction with the accompanying drawings; in which.

DETAILED DESCRIPTION OF A PREFERRED EMBODIMENT

Figure 1:
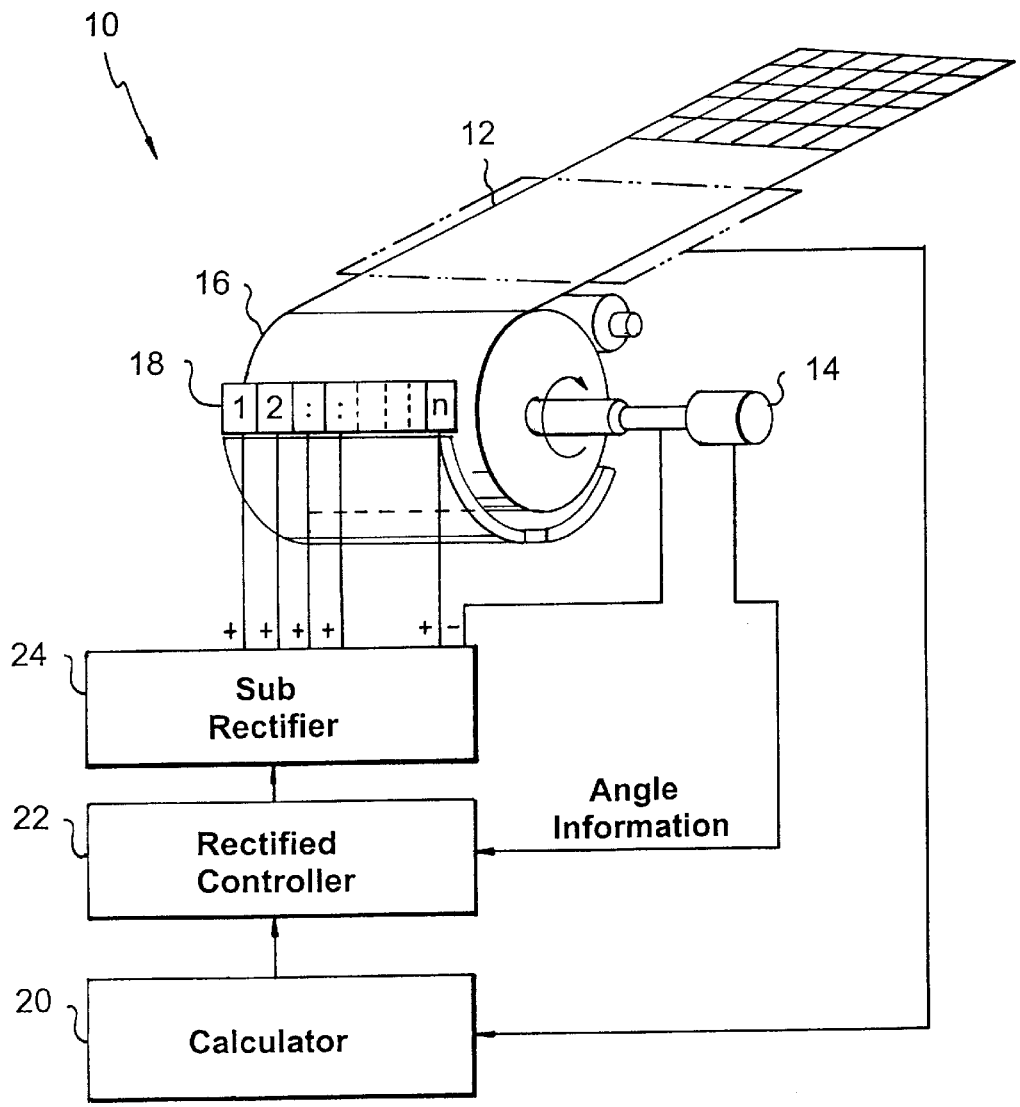
FIG. 1 illustrates a generally diagrammatic perspective representation of an apparatus for electrolytically producing an electrolytic copper foil, pursuant to the current state-of-the-art.

Reverting in particular to FIG. 1 of the drawings, illustrating an apparatus 10 for producing electrolytic depositions of metallic material, such as copper which is employed in the forming of an electrolytic copper foil 12. In that instance, there is illustrated an encoder 14 which determines the angular rotation of a cathode drum 16, wherein the drum is partially immersed in an electrolytic solution. A plurality of sub-anodes 18 are spaced across the width of the drum 16, each of which is adapted to be imparted a selected electric current density. A suitable calculator 20 computes deviations in the measured thickness of the intended foil thickness of the target foil, and transmits such information as to variations to a rectifier controller 22, which also receives angle information from the encoder 14. The current or quantities of electricity supplied to the various sub-anodes which are spaced across the width of the drum 16 is controlled by associated sub-rectifiers 24 in order to provide an increase or decrease in current supplied thereto so as to enable control over the uniformity in the thickness of the metallic or copper foil which is being produced. In essence, the prior art structure as described above, which is essentially that of the Kubo, et al., U.S. Pat. No. 5,326,455, discloses an electrolytic deposition apparatus in the form of a bath, whereas it is also possible to provide for a fluid-containing anode drum or fluid head having a plurality of a small electrodes, such as sub-anodes, spaced across the width thereof.

Figure 2:
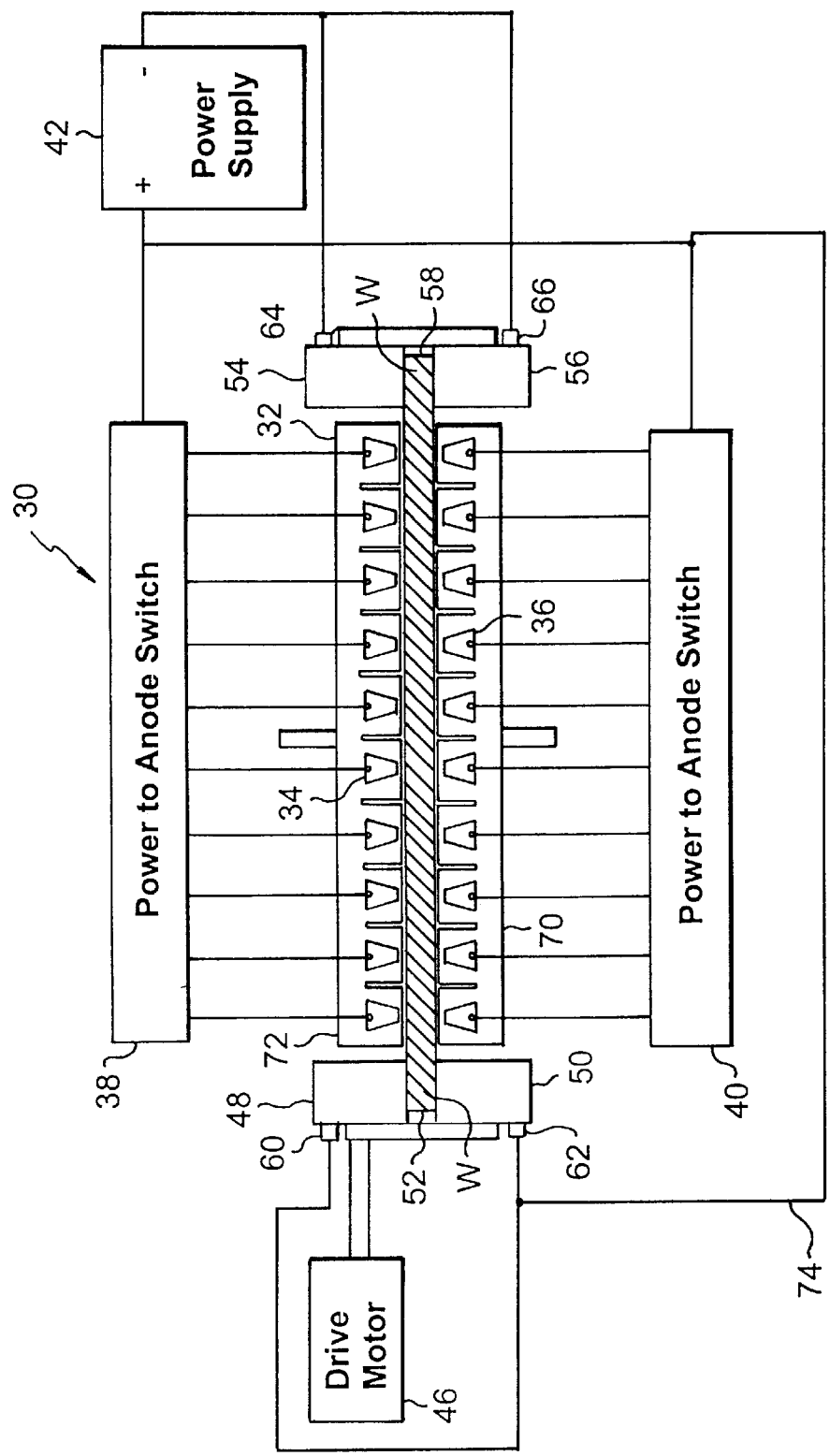
FIG. 2 illustrates a perspective front elevational view of an inventive selective electrode plating arrangement for electrolytic metallization or deposition on a substrate.
Figure 3:
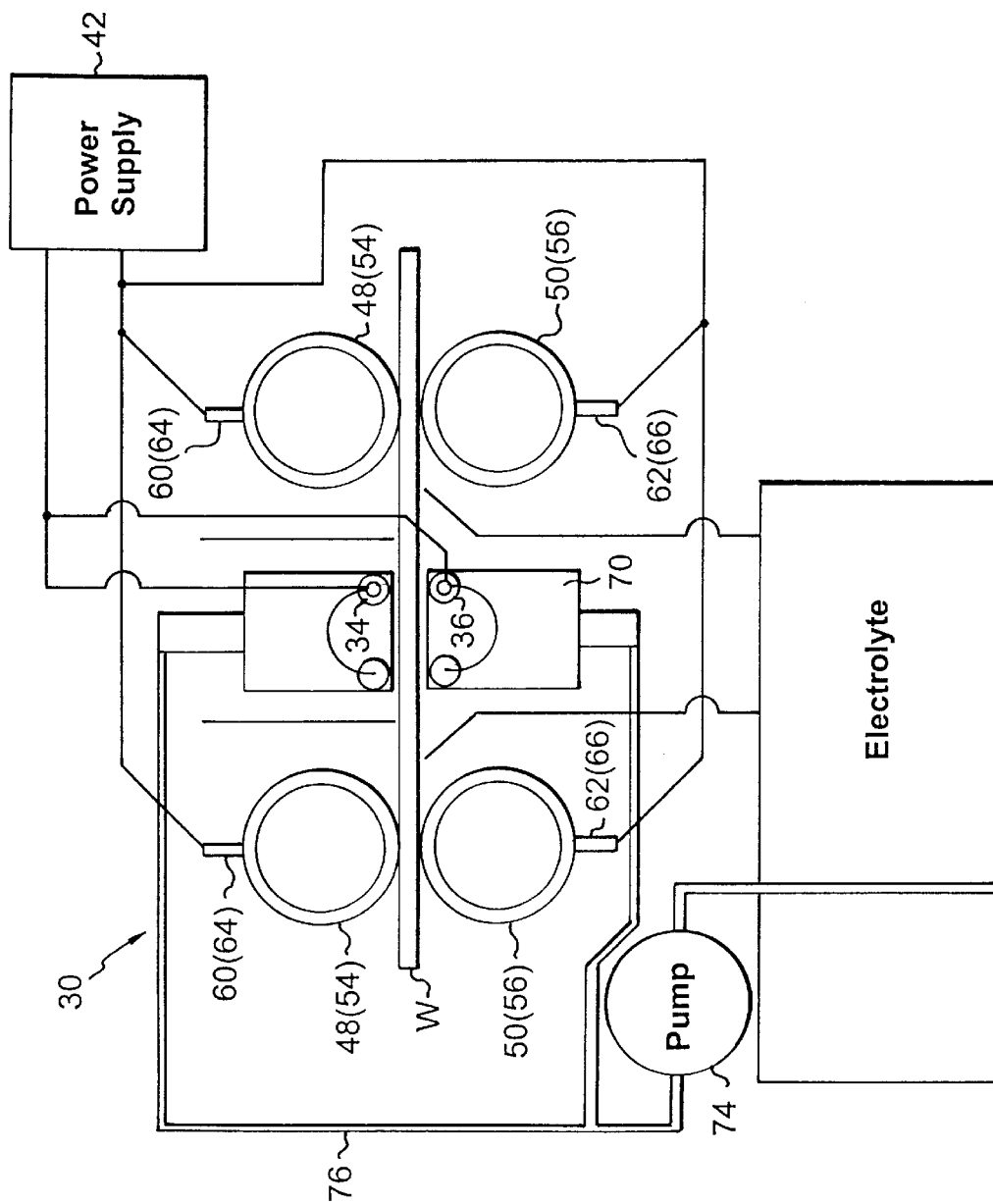
FIG. 3 illustrates, generally diagrammatically, a side elevational view of the arrangement of FIG. 2.

However, in accordance with the invention, in order to contemplate a unique and versatile construction of a selective electrolytic metallization/deposition apparatus 30 which enables obtaining further advantages while utilizing presently known fluid head technology in the implementing of electrolytic metallization, coating, plating and etching processes, there is provided a transport arrangement or installation 32, which, if desired may be of a fluid-containing head design, as shown in FIGS. 2 and 3 of the drawings.

A plurality of anodes are in the form of linear arrays or banks of sub-anodes 34, 36 which are, respectively, located on opposite sides of a product which is being conveyed by the transport arrangement 32. The product may be either a continuous roll or web W forming the substrate which is to be imparted a metallized coating or deposition, or may be constituted of discrete components advanced in succession, such as circuit boards. Each array of sub-anodes extends across substantially a major portion of the width of the product W with each sub-anode 34 being connected to anode power switch 40, and sub-anodes 36 being connected anode power switch 38. In turn, the anode power switches 38, 40 are connected to a suitable electrical power supply 42, with the power being selective to the various sub-anodes in order to provide a uniform degree of deposition of metal across the surface of the product being processed.

In order to attain the inventive object, the transport arrangement 32 comprises an external transport mechanism which, in this instance, consist of a drive motor 46 for driving a pair cooperative wheels 48, 50 engaging opposite surfaces along the one longitudinal edge 52 of the product W being processed. Also similar contacted by upper and lower wheels 54, 56 is the opposite edge 58 of the product, so as to convey the product consisting of the foil or sheets W through the transport arrangement at a predetermined rate of advancing speed. Each of the wheels 48, 50, 54, 56 contacting respectively the upper and lower surfaces of the product is respectively, in electrical contact with a cathode brush 60, 62, 64, 66 which, in turn, is connected to the power supply 42 which also supplies the sub-anodes with electrical current, and ensures that the product W is always in electrical contact with the cathode brushes with the wheel 50 being a cathode drive wheel.

As illustrated, in further detail in FIG. 3 of the drawings, the transport arrangement 32, in that instance, includes a fluid-containing fluid head 70 which has a nitrogen curtain input 72 connected to a sump 74 and pump system 76 for electrolyte, with the sub-anode electrodes shown in FIG. 3 of the drawings. The nitrogen curtain input is provided at the locations illustrated whereby the entire system advantageously facilitates the continuous electrical contact of the product W by the cathode brushes in operative conjunction with the selectively actuated or controllable power-supplied sub-anodes extending in arrays across respectively the upper and lower surfaces of the product. This will provide an improved metallization and deposition performance while also enabling fabrication to be implemented continuously. The continuous electrical contact provided for by the cathode brushes enables the entire apparatus to provide a capability for selective metallization/deposition which is ordinarily impossible to attain within the format of currently employed fluid heads for individual circuit processing.

From the foregoing, it becomes readily apparent that the invention is clearly directed to novel and advantageous features not at all contemplated in the art, irrespective as to whether applied to fluid head apparatuses, or to a product transport system providing for continuous electrical cathode contact with the surfaces of the product which is to be electrolytically metallized.

While there has been shown and described what is considered to be a preferred embodiment of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A method for the electrolytic metallization of a workpiece; said method comprising:

(a) imparting a metallizing electrolyte to said workpiece;

(b) conveying said workpiece past said electrolyte;

(c) causing an electrical power supply to maintain electrical contact with said workpiece while avoiding exposure of said electrical contact means to said electrolyte;

(d) spacing a plurality of anode electrodes across said workpiece proximate said electrolyte, said anode electrodes each being connected to said electrical power supply;

(e) individually controlling an electrical potential across each said anode electrode so as to provide a specified electrical field strength at different anode electrode positions across said workpiece and along the direction of conveyance of said workpiece during transport of said workpiece past said electrolyte imparting means; and (f) arranging said anode electrodes to extend in linear arrays above and below said workpiece; and connecting power control switches to each of said anode electrodes for selectively controlling the electrical potential of each of said anode electrodes; whereby said electrical potential is variably controllable in any direction over the area of said workpiece and along the direction of conveyance of said workpiece.

2. A method as claimed in claim 1, wherein said workpiece conveying is effected by cooperating pairs of wheels drivingly contacting opposite side edges of said workpiece; and a drive motor being connected to at least one of said pairs of wheels to advance said workpiece through said apparatus.

3. A method as claimed in claim 2, wherein said pairs of drive wheels are in electrical communication with said electrical power supply for maintaining an electrical potential on said workpiece.

4. A method as claimed in claim 3, wherein said pairs of wheels each form cathode electrodes contacting said workpiece, said wheels each being continuously contacted by a cathode brush which is electrically connected to said electrical power supply.

5. A method as claimed in claim 1, wherein said electrolyte comprises a metal-containing fluid.

6. A method as claimed in claim 5, wherein said electrolyte comprises electrolytic copper.

7. A method as claimed in claim 5, wherein said electrolyte comprises nickel.

8. A method as claimed in claim 5, wherein said electrolyte comprises gold.

9. A method as claimed in claim 1, wherein said workpiece is constituted of a continuous web which is conveyed through said electrolyte imparting means.

10. A method of claimed in claim 1, wherein said workpiece comprises a panel forming a substrate for electrical circuitry.

11. A method for the electrolytic metallization of a workpiece; said method comprising:

(a) providing a fluid head for imparting a metallizing electrolyte to said workpiece;

(b) conveying said workpiece past said fluid head;

(c) connecting an electrical power supply for maintaining electrical contact with said workpiece while avoiding exposure of said electrical contact means to said fluid head by forming said electrical contact externally of said fluid head;

(d) spacing a plurality of anode electrodes across said workpiece proximate said fluid head, said anode electrodes each being connected to said electrical power supply;

(e) individually controlling an electrical potential across each said anode electrode so as to provide a specific electrical field strength at different anode electrode positions across said workpiece during transport of said workpiece past said metallizing fluid head; and (f) said anode electrodes extend in linear arrays above and below said workpiece; and power control switches are connected to each of said anode electrodes for selectively controlling the electrical potential of each of said anode electrodes whereby said electrical potential is variably controllable in any direction over the area of said workpiece and along the direction of conveyance of said workpiece.

12. A method as claimed in claim 11, wherein said workpiece conveying is effected by cooperating pairs of wheels drivingly contacting opposite side edges of said workpiece; and a drive motor being connected to at least one of said pairs of wheels to advance said workpiece through said apparatus.

13. A method as claimed in claim 12, wherein said pairs of drive wheels are in electrical communication with said electrical power supply for maintaining an electrical potential on said workpiece.

14. A method as claimed in claim 13, wherein said pairs of wheels each form cathode electrodes contacting said workpiece, said wheels each being continuously contacted by a cathode brush which is electrically connected to said electrical power supply.

* * * * *

UNITED STATES PATENT AND TRADEMARK OFFICE
CERTIFICATE OF CORRECTION

PATENT NO. : 6,203,685 B1
DATED : March 20, 2001
INVENTOR(S) : M. Acciai et al.

It is certified that error appears in the above-identified patent and that said Letters Patent is hereby corrected as shown below:

Column 6, claim 10,
Line 50, "of claimed" should read -- as claimed --

Column 7, claim 11,
Line 2, "specific" should read -- specified --
Line 4, "said workpiece during transport of said" should read -- said workpiece and along the direction of conveyance of said workpiece --

Signed and Sealed this

Fifteenth Day of January, 2002

Attest:

Attesting Officer

JAMES E. ROGAN
Director of the United States Patent and Trademark Office